United States Patent [19]

Knoedl, Jr.

[11] 4,053,839
[45] Oct. 11, 1977

[54] METHOD AND APPARATUS FOR THE FREQUENCY MULTIPLICATION OF COMPOSITE WAVES

[76] Inventor: George Knoedl, Jr., 139 Waverly Ave., Patchogue, N.Y. 11772

[21] Appl. No.: 364,647

[22] Filed: May 29, 1973

[51] Int. Cl.² ............................................. H03B 19/00
[52] U.S. Cl. ....................................... 328/38; 328/151; 328/14; 328/16; 84/1.19; 331/58
[58] Field of Search ........................ 328/16, 17, 21, 22, 328/23, 151, 37, 14, 38; 331/53, 58, 47; 321/60, 61; 84/1.01, 1.19; 179/15.55

[56] References Cited

U.S. PATENT DOCUMENTS

| | | | |
|---|---|---|---|
| 3,467,783 | 9/1969 | Magnuski | 179/15.55 |
| 3,784,754 | 1/1974 | Hagiwara et al. | 179/15.55 |
| 3,866,127 | 2/1975 | Demos et al. | 328/38 |

Primary Examiner—John S. Heyman
Attorney, Agent, or Firm—Wolfgang G. Fasse; Willard W. Roberts

[57] ABSTRACT

A frequency multiplying system and method in which a time varying analog input signal is sampled and stored in a memory matrix at a predetermined rate. The signal thus stored is read out from the memory matrix at a different rate and reconstructed into a time varying analog signal. The storage rates and readout rates are controlled by a command signal generator including a master run-up generator run up at a first run-up rate and reset by the fundamental input frequency, the highest level at the output of the run-up generator being continually stored in a memory circuit. Slave run-up generators which cycle at frequencies corresponding to the storage and reading-out of the sampled information are reset upon coincidence of their levels with the level in the memory connected to the master run-up generator. The command signal generator may be in either digital or analog form employing either counters or integrators as run-up generators. The analog input signal may be processed by either digital or analog means.

27 Claims, 7 Drawing Figures

METHOD AND APPARATUS FOR THE FREQUENCY MULTIPLICATION OF COMPOSITE WAVES

BACKGROUND OF THE INVENTION:

This invention relates to the generation and/or regeneration of cyclic composite signals whose frequencies may or may not be harmonically or musically related, whose amplitudes are independent of frequency, and particularly whose frequencies may be any multiple "N" times the input frequency such that "N" is any positive real number, rational or irrational, less than, greater than or equal to unity.

In audiometery it is occasionally desirable to listen on the spot to cyclic composite signals, whose frequencies may be in the ultra-sonic or sub-sonic ranges, in their entirety and without disturbing their harmonic structure. This is particularly useful in analyzing coronary conditions, since the ear can detect a much smaller change in harmonic structure and thus in waveshape, than can an oscilloscope or an electrocardiogram.

One can record the phenomena and then play it back at a different speed but at the sacrifice of simultaneity and particularly for sub-sonic phenomena, one must record for a long interval of time and only have accumulated enough information to listen for a short time.

Also in music it is frequently desirable to produce automatically and simultaneously, several tones which are related musically and whose harmonic structures may be identical to the input signal or, selectably, entirely different. In other words, to play (or sing) harmonies to the single melody line of an instrument or vocalist.

A known system for providing composite output signals of harmonics of a signal is disclosed in U.S. Pat. No. 3,403,343, but this system requires the use of a permanent storage system for storing the amplitude values of a sine wave.

SUMMARY OF THE INVENTION

To implement simultaneity, the present invention provides a system that monitors the input signal on a cycle by cycle basis. Briefly, a composite signal can be sampled, stored and reconstructed to any degree of accuracy if samples of the instantaneous voltage of the waveform are taken in appropriately small increments and at regular intervals. If the signal is cyclic the intervals must be coherent from one cycle to the next.

Thus, in accord with a feature of this invention, the start of each cyclic period of an input signal is determined and marked (e.g., with a pulse) and the period (P = 1/F) is divided into "K" equal intervals during each of which a sample of the input signal is taken. These "K" samples which describe the input waveform in its entirety are placed in storage where they are updated during each cycle of the input signal. Once the information is stored it may be non-destructively recalled and reconstructed at any sampling rate, the resultant frequency of which is the product of the original frequency and the ratio of the sampling rates.

Where Po and Fo are the period and frequency respectively of the input signal, Pn and Fn are the period and frequency of the output signal, So and Sn are the sampling frequencies for the input and output signals respectively, "K" is the number of samples per cycle, $$N = \frac{Sn}{So}, \text{ and } P = \frac{1}{F} = \frac{K}{S}:$$

$$\frac{Pn \cdot Sn}{K} = \frac{Po \cdot So}{K}$$

$$\frac{Sn}{Fn} = \frac{So}{Fo}$$

$$\frac{1}{Fn} = \frac{So}{Sn \cdot Fo} = \frac{1}{N \cdot Fo}$$

$$Fn = N \cdot Fo$$

Thus, if the output is reading samples at a rate "N" times that of the input, then the output will complete "N" cycles for each cycle of the input. Moreover, since the output signal is reconstructed from samples of the input signal taken in sequence, the amplitude and form of the output signal will be the same as that of the input regardless of the frequencies of either. In the system of the invention, the frequency NFo is produced whereby N is not necessarily an integer. It may by any positive real number, rational or irrational number. Further, in the system of the invention the frequency error is not cumulative with the factor N.

BRIEF FIGURE DESCRIPTION:

In order that the invention may be clearly understood, it will now be described, by way of example, with reference to the accompanying drawings, wherein:

FIG. 2b is a series of waveforms generated at various points in the circuit of FIG. 2a;

FIG. 6 is a block diagram of a sequencing logic circuit which may be employed in the circuit of FIG. 2a.

Figure 1:
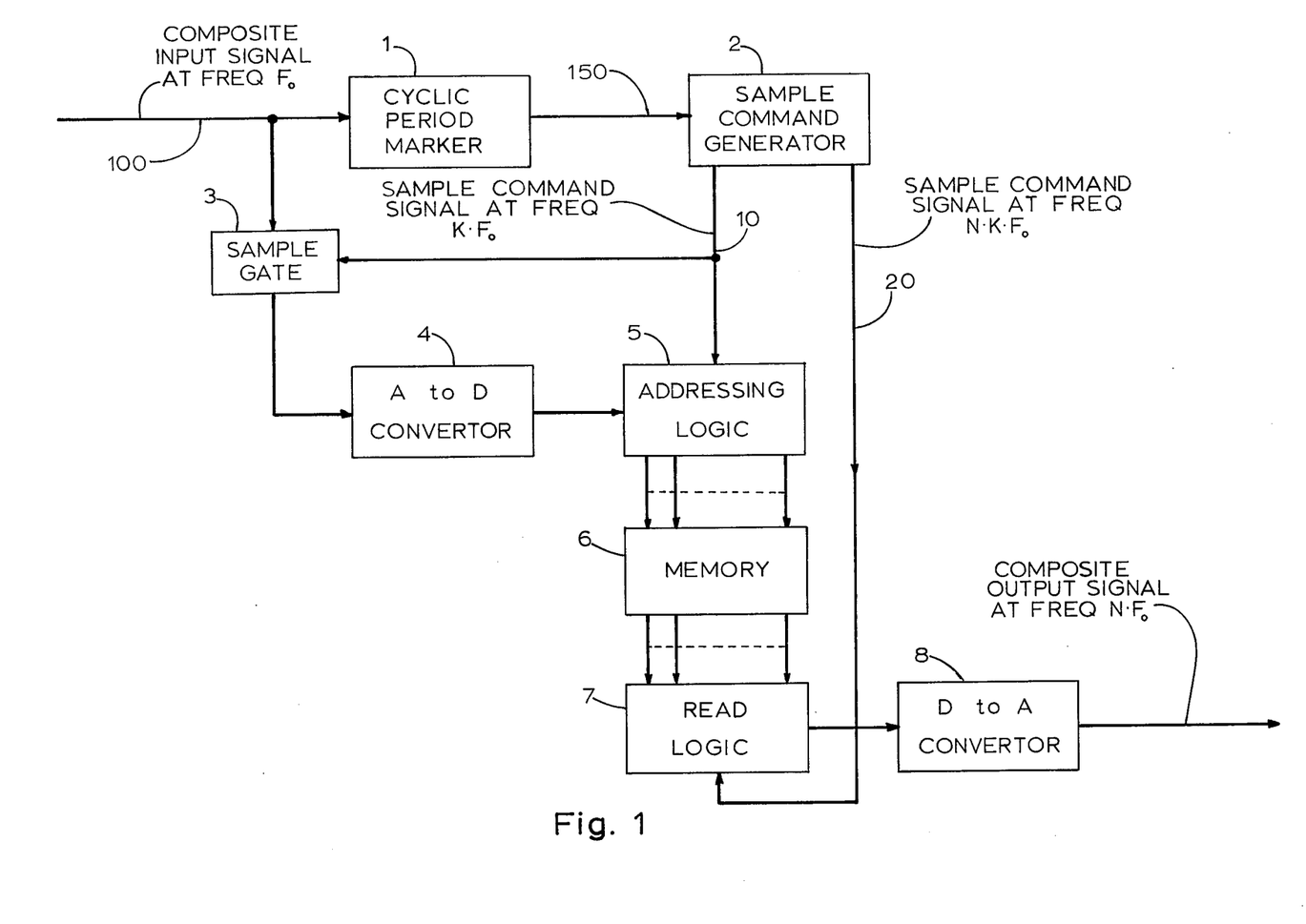
FIG. 1 is a schematic block diagram of a preferred embodiment of this invention.

DETAILED DESCRIPTION OF EXAMPLE EMBODIMENTS:

Referring now to FIG. 1, this circuit is particularly adaptable to the production of output signals by digital techniques. Although the arrangement may be implemented with analog elements, as will be explained in greater detail in the following paragraph, the use of digital elements will quantize the measuring errors involved in the arrangement and allow their maximum amounts, which might otherwise be cumulative, to be controlled. It is therefore preferred in most cases that the arrangement of FIG. 1 employ digital elements.

Figure 2A:
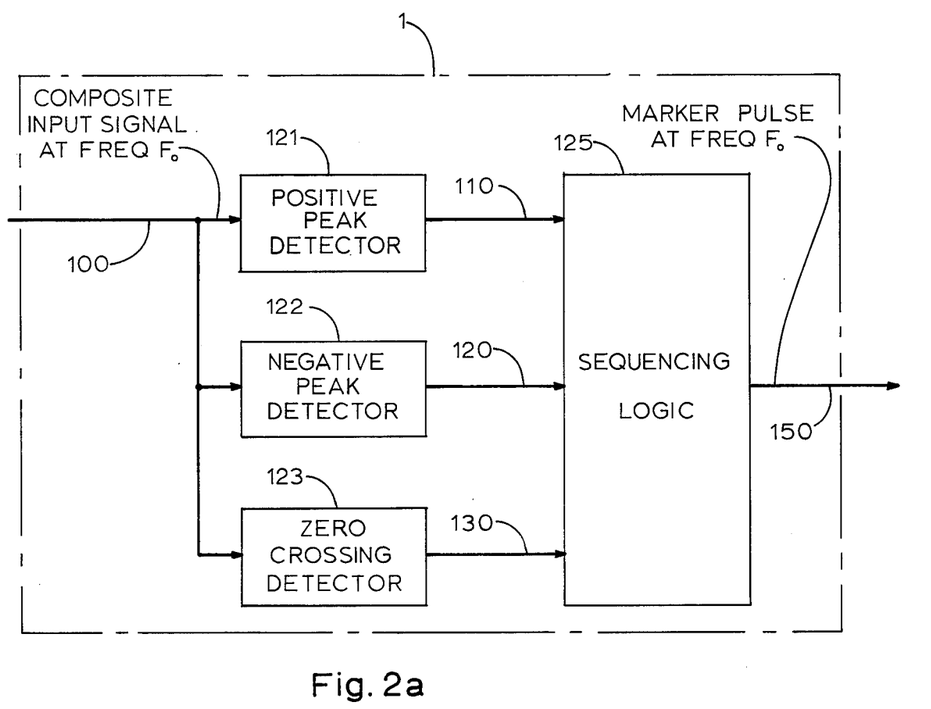
FIG. 2a is a schematic block diagram of one implementation of the cyclic period marker shown in FIG. 1.
Figure 2B:
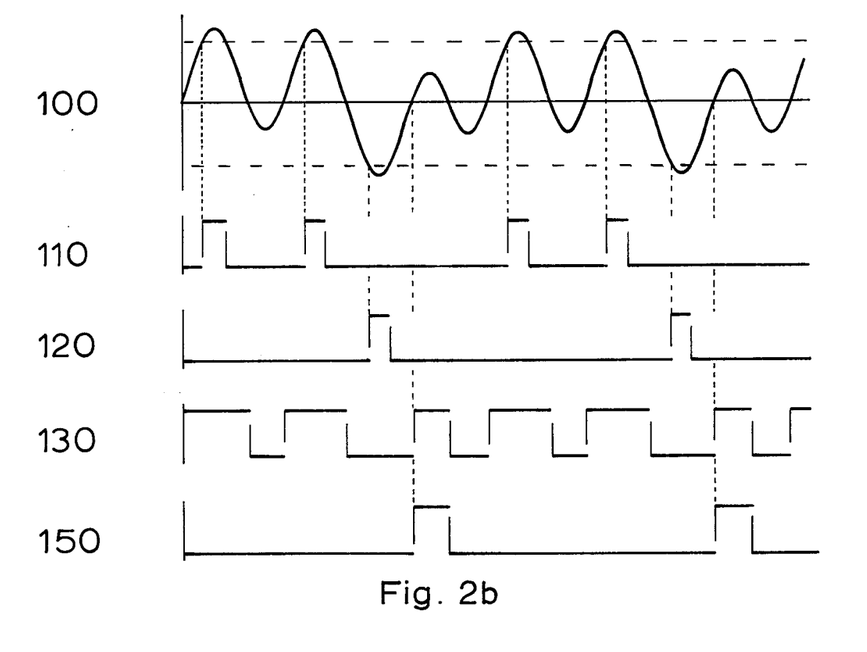
Figure 3:
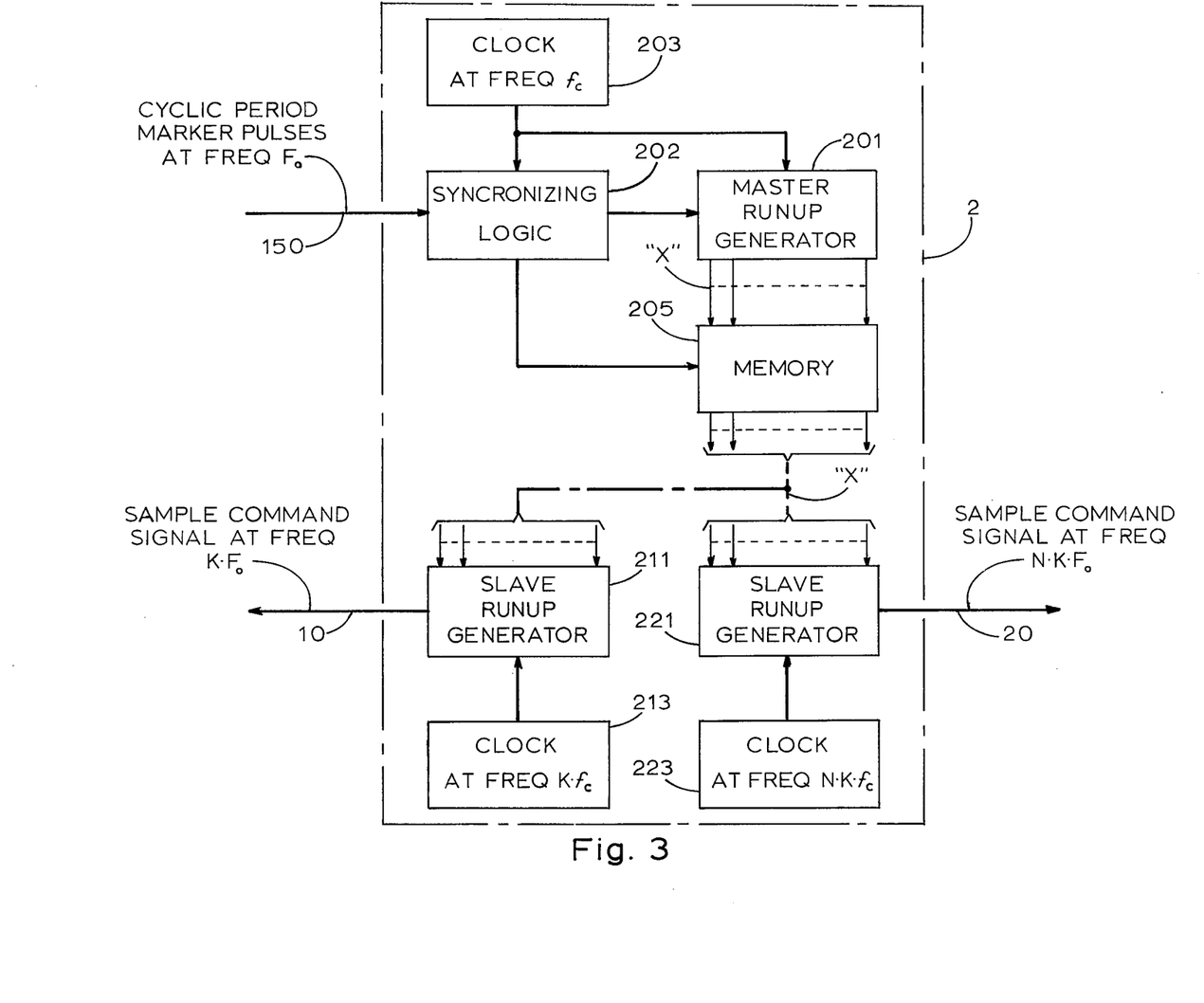
FIG. 3 is a schematic block diagram of one implementation of the sample command generator shown in FIG. 1.

Referring further to FIG. 1, composite input signals having a fundamental frequency Fo, of which a harmony NFo is to be produced, are applied to a line 100. This signal is applied to a cyclic period marker 1 for producing pulses on the line 150 at the frequency Fo. This circuit will be described in greater detail in the following paragraphs with reference to FIG. 2. The pulses at frequency Fo on line 150 are applied to a sample command signal generator 2. This circuit, which will be explained in greater detail with reference to FIG. 3, provides command pulses at the frequency KFo on the line 10 and command pulses at the frequency NKFo on the line 20. The pulses at frequency KFo on line 10 are applied as shifting pulses to an addressing logic circuit 5, which may be a shift register, or alternatively may be a counter matrix. The pulses on line 10 are also applied as control pulses to a sample gate 3. The sample gate couples the composite input signal on line 100 to an analog to digital convertor 4. The parallel output of the addressing logic circuit 5 is applied to a conventional memory circuit 6, and the output of the memory circuit 6 is applied in parallel to a read logic circuit 7. The read logic circuit 7 may be a counter matrix circuit or a shift register. The output of the sample command generator on line 20 at frequency NKFo is applied to the read logic circuit 7 as a shift pulse. The output of the read logic circuit 7 is applied to a digital to analog convertor 8, the output of the convertor 8 being a composite output signal at the frequency NFo. The pulses on line 20 non-destructively couple the memory 6 to the digital to analog convertor 8. The output of the digital to analog convertor 8 is thus a replica of the input waveform on line 100 at the new frequency NFo.

As above discussed, the output KFo of the sample command generator 2 shifts the composite input signal, after conversion to digital form, to the addressing logic circuit 5, whereby the signal has been divided into "K" equal sampling intervals. These "K" samples, which describe the input waveform in its entirety are stored in the memory circuit 6, and this storage is updated during each cycle of the input signal. Once the information is thus stored, it may be non-destructively recalled and reconstructed at any sampling rate, for example the sampling rate NKFo of the signals on line 20. By the use of the digital to analog convertor 8, the entire composite output signal is reproduced at a frequency NFo at the output of the convertor 8.

The cyclic period marker 1 of FIG. 1 is employed to generate pulses at a frequency Fo in response to the input signal at Fo. This circuit, which is particularly adapted to generate pulses at the fundamental rate from composite signals may be omitted, for example, if pulses at a pure fundamental rate can otherwise be assured at the input of the circuit. FIG. 2a illustrates a preferred embodiment of this circuit and FIG. 2b illustrates waveforms appearing at various points in the circuit of FIG. 2a. Since the waveforms of almost every composite signal occurring in nature contains only one sequence of:

a. a set of one or more most positive peaks followed by b. a set of one or more most negative peaks followed by c. a zero crossing, during each cycle of the fundamental, sequencing logic may be provided to produce one and only one pulse on the output line 150 per sequence, and thus per cycle of the fundamental wave. A typical composite waveform of this type is illustrated in FIG. 2b, this waveform being applied, for example, to the input line 100 of the cyclic period marker of FIG. 2a.

The circuit of FIG. 2a is comprised of a positive peak detector 121, a negative peak detector 122 and a zero crossing detector 123, the inputs of all of these circuits being connected to the line 100. Each of these circuits may be of conventional nature. The output of the positive detector 121 on line 110, the output of the negative detector 122 on line 120 and the output of the zero crossing detector 123 on line 130 are all applied to a sequencing logic circuit 125, the output of the sequencing logic circuit appearing on line 150. The sequencing logic circuit 125, one embodiment of which will be explained with reference to FIG. 6, serves to provide an output pulse on the line 150 only upon the occurrence of the sequence of outputs from the detectors 121, 122 and 123 as above discussed. Referring to FIG. 2b it is seen that the positive peak detector 121 provides an output on the line 110 at each positive peak of the composite waveform above a given positive level, the negative peak detector 122 provides an output on the line 120 in response to the occurrence of each negative peak of the composite waveform more negative than a determined level. The given positive and negative levels are determined as a portion of the peak values of the composite waveform. The zero crossing detector 123 provides an output on line 130 that changes state at each zero crossing. In other words, the zero crossing detector 123 produces a pulse on line 130 for every positive zero crossing. As is apparent from FIG. 2b, the output of the sequencing logic circuit appears on line 150 only in response to the sequential occurrence of pulses on lines 110, 120, and 130.

Although the peak detectors 121 and 122 generate sufficient information to recognize the desired sequence, the zero detector 123 generates a pulse that is more stable in timing, so that by employing the output of the zero crossing detector 123 to initiate the output of the sequencing logic circuit 125, the arrangement of FIG. 2a is less susceptible to noise.

One embodiment of the sample command generator 2 of FIG. 1 is illustrated in FIG. 3. This circuit responds to input pulses at the frequency Fo on line 150 and generates a sample command signal at the frequency KFo on line 10, and a sample command signal at the frequency NKFo on the line 20.

The circuit of FIG. 3 is comprised of a master run-up generator 201, which may be comprised of a plurality of cascade connected binary counters, such as IC type 74163. The master run-up generator is connected to the clock 203 which runs at a frequency $f_c$. The parallel outputs "X" of the master run-up generator are connected to inputs of a memory 205, which may be comprised of a plurality of bistable latches, such as IC type 7475. The synchronizing logic circuit 202 may be comprised of a gated two stage ring counter or gated two stage shift register. An input pulse on the line 150 enables the synchronizing logic circuit 202, whereby the next succeeding clock pulse from the clock 203 is applied to the memory circuit 205 to effect the storage of the number on the lines "X" in the memory 205. The next succeeding clock pulse is applied by way of the synchronizing logic circuit 202 to the master run-up generator 201 to effect the resetting of the master run-up generator. Since the synchronizing logic circuit 202 is a two stage device, no further pulses are channeled from the clock to the master run-up generator or memory 205 until the following marker pulse on line 150. The count stored in the memory 205 thereby corresponds to the period of the pulses at frequency Fo applied to line 150.

The circuit of FIG. 3 further comprises a clock 213 running at a frequency $Kf_c$. These pulses are applied to a slave run-up generator 211, which may, for example, be comprised of a cascade circuit of binary counters such as IC type 74163 and magnitude comparators such as IC type 7485, which count up to the number applied thereto by the memory circuit 205 and then are reset. Alternatively, the slave run-up generator 211 may be comprised of a cascade of presettable up/down counters such as IC type 74191 which are loaded up to the number set in the memory circuit 205 and then count down to zero at the clock frequency $Kf_c$. In either case, the slave run up generator 211, after counting the number of pulses at the clock rate $Kf_c$ corresponding to the stored number in the memory circuit 205, generate a sample command pulse on line 10 at the frequency KFo.

Since the slave run-up generator 211 and the master run-up generator 201, in the circuit of FIG. 3, count up to the same number, i.e., the number stored in the memory 205, and since the slave run-up generator is counting at a rate "K" times as fast as the master run-up generator 201, the slave run-up generator completes "K" cycles for every cycle of the master run-up generator 201, thereby producing "K" sample command pulses for each cycle of the input signal applied to line 150.

In a similar manner, a clock 223 running at a frequency $NKf_c$ is connected to a slave run-up generator 221 which may be identical to the slave run-up generator 211. The slave run-up generator 221 is also connected to the parallel outputs of the memory circuit 205. The output of the slave run-up generator 221 is thereby a sample command signal at the frequency NKFo.

Since the ratio of the output frequency NFo to the input frequency Fo is determined by the ratio of the output sampling rate NKFo to the input sampling rate KFo and this ratio is determined by the ratio of the clock frequencies $NKf_c$ and $Kf_c$, and hence the clocks 213 and 223 are separate and independent and can have frequencies in any ratio "N", it is apparent that the factor "N" may be any real positive number.

In the arrangement of the invention, then, the frequency multiplication which occurs is an inherent result of the fact that the run-up generators operate on different time bases in such a manner as to cause all time related phenomena to occur at rates which are in the ratio of these time bases.

In a modification of the invention, the system of FIG. 1 may include a plurality of read logic elements 7, and a plurality of digital to analog convertors 8 driven at a plurality of sampling rates $N_1KF_o$, $N_2KF_o$, $N_3KF_o$ etc, which may be derived in the sample command generator 2 in the same manner as the command signal at frequency $NKS_o$. These signals may be keyed in either manually or by a computer that will determine what "mode" to play the harmonies in, for example, in a musical instrument. For example, depending upon what note in the scale is being played on such a musical instrument, two harmonies in thirds might be in either major or minor intervals.

Figure 4:
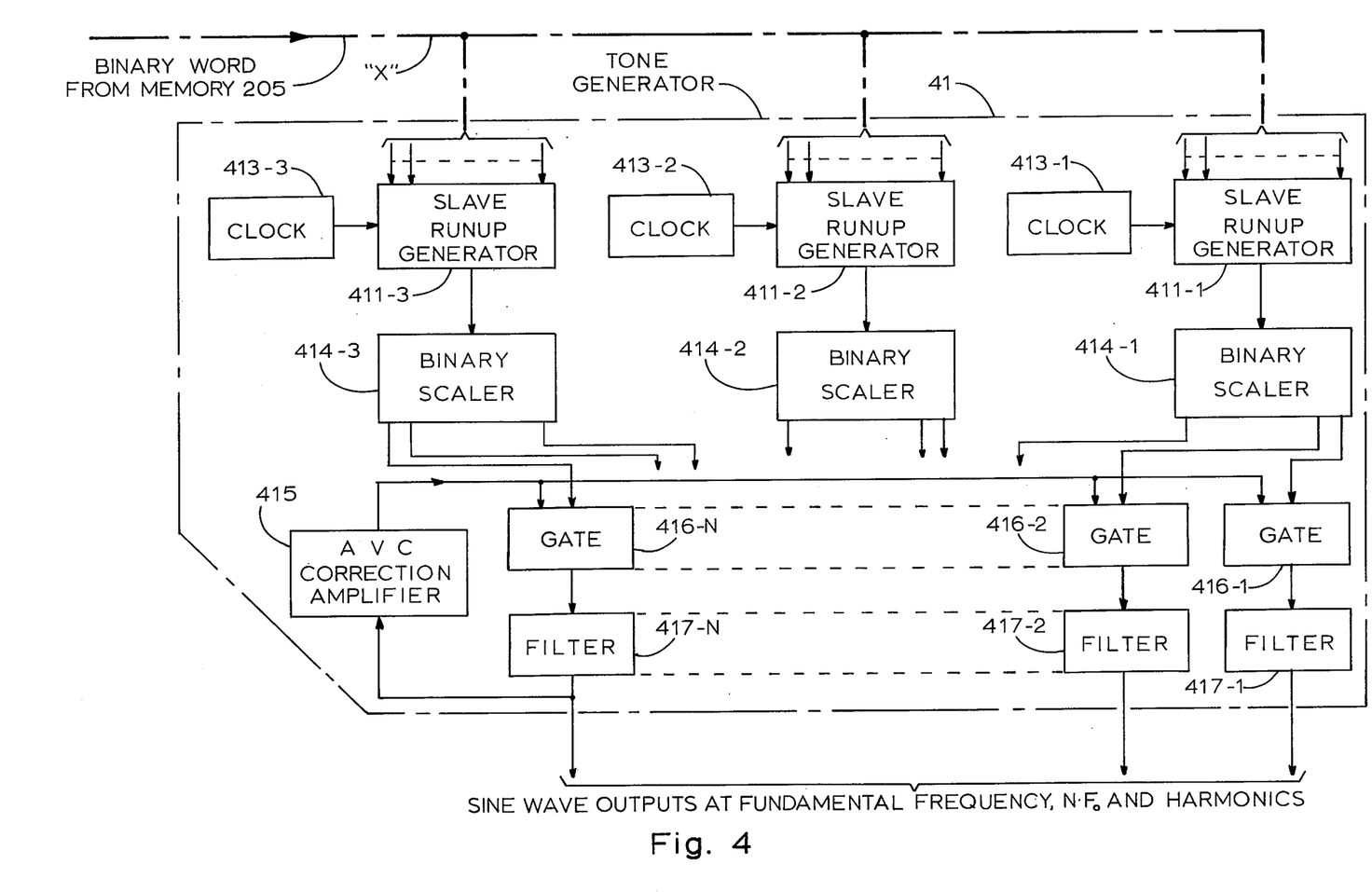
FIG. 4 is a schematic block diagram of a tone generator used in an alternate embodiment of the invention, in place of the sampling circuitry.

In a still further modification of the invention, the sampling circuit 3, 4, 5, 6, 7, and 8 of FIG. 1 may be replaced by a plurality of tone generators 41 as illustrated in FIG. 4. These tone generators are an extension of the sample command generator 2, and may be provided to directly produce the frequencies of the new fundamentals and their harmonics. These signals may be converted to sinusoidal waves and then mixed as desired to produce any tonal character that one desires.

One embodiment of such a circuit is shown in FIG. 4. The slave run-up generators 411 which are loaded with the binary coded word "X" from memory 205 (FIG. 3) produce pulses at twice the frequencies of interest. Binary scalers 414 divide these frequencies in half, quarters, etc, and produce square waves at all the desired frequencies. Sine waves are derived from the square waves with filters 417. For example, if the fundamental frequency of one tone generator 41 is NFo, then the slave generators 413-1, 413-2, and 413-3 might produce pulses at frequencies $16NF_o$, $12NF_o$, $10NF_o$ respectively. The binary scalers, 414-1, 414-2, and 414-3 then produce square waves at the frequencies $8NF_o$, $4NF_o$, $2NF_o$ and $NF_o$; $6NF_o$ and $3NF_o$; and $5NF_o$ respectively. After filtering, the tone generator 41 will have available at its outputs sinusoids at the fundamental frequency $NF_o$ and its $2^{nd}$, $3^{rd}$, $4^{th}$, $5^{th}$, $6^{th}$, and $8^{th}$ harmonics.

The amplitudes of the sine wave outputs are kept constant over the frequency range by an AVC servo loop comprised of programable level limiter gate, 416-N, a two stage RC low pass filter, 417-N whose upper 3db point is below the lowest frequency of interest and a sampling AVC correction amplifier 415 similar to that used in a conventional TV receiver.

The AVC servo loop operates as follows. As the frequency of the square wave increases, the attenuation factor of the two stage RC filter 417 increases by the square thus causing the output of the filter to decrease in amplitude. The sampling AVC amplifier senses this decrease and makes a proportional increase in the control voltage to the gate 416 which restores the output of the filter 417 to the proper level. This circuit operates in a similar manner if the frequency decreases. Since all the remaining filters 417 are tuned proportionally for the frequencies at which they are to operate and they all have the same square law relationship of frequency to attentuation, and since all the frequencies in one tone generator 41 track, the same correction voltage applied to all gates 416 will cause the outputs of all filters to track.

Figure 5:
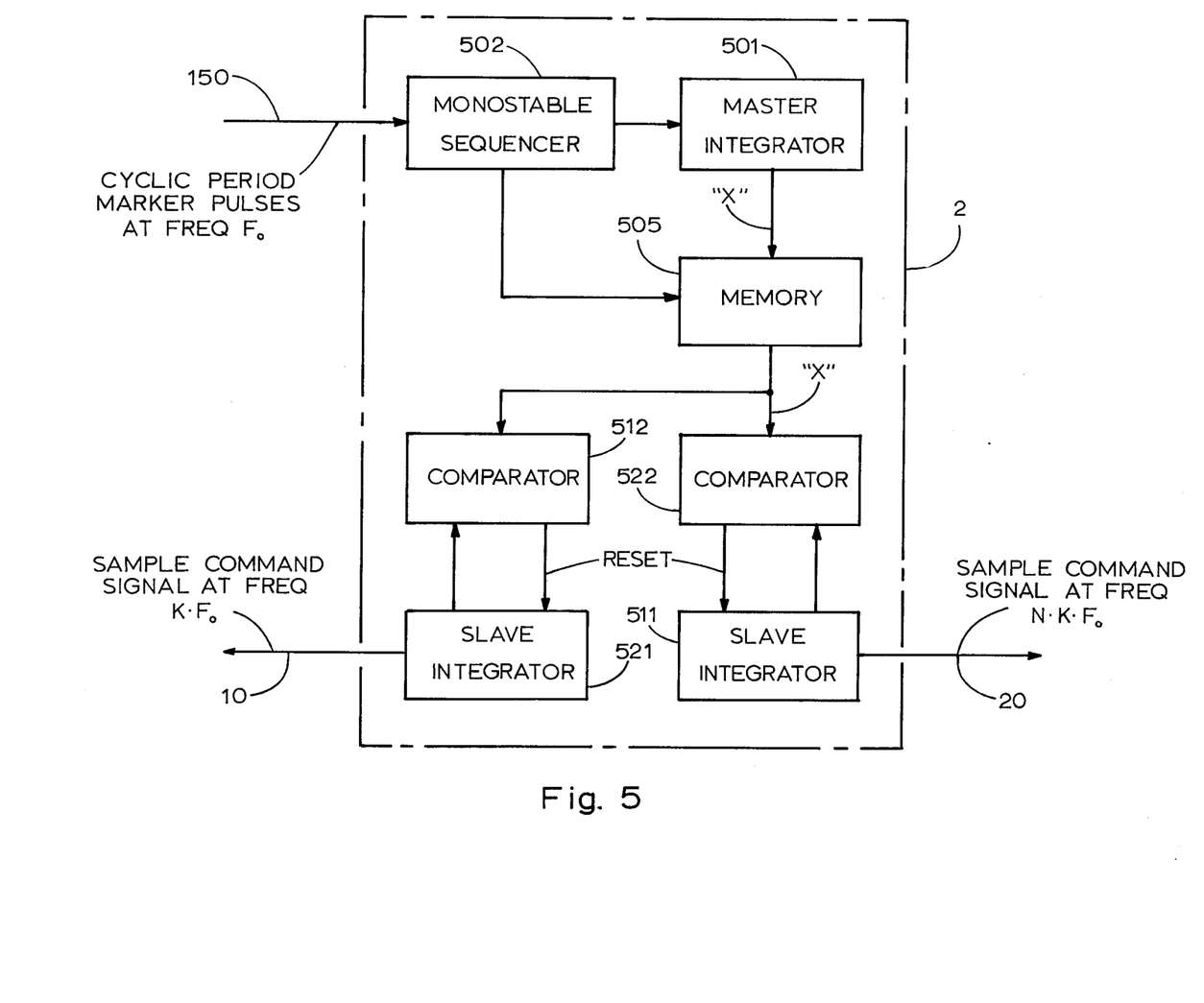
FIG. 5 is a block diagram of a command signal generator employing analog circuitry which may be employed in accordance with a further embodiment of the invention.

The circuit of FIG. 1 may also be modified to employ analog elements. In this modification, the analog to digital convertor 4 and the digital to analog convertor 8 are deleted and bypassed, and the digital memory 6 is replaced by an analog memory having elements that may be gated charge storing devices such as capacitors. In this case, the sample command generator of FIG. 3 may be replaced by the sample command generator illustrated in FIG. 5. Referring now to FIG. 5, the modified sample command generator is comprised of a mono-stable sequencer 502, such as a monostable multivibrator, a master integrator 501, which may be a resettable integrator, and an analog memory circuit 505 comprised of a gated charge storing element such as the sample and hold circuit found in conventional sampling oscilloscopes, which store a quantity as a voltage rather than as a digital number. In this arrangement, the input pulse on line 150 at frequency $F_o$ triggers the monostable multivibrator, for example, so that at the leading edge of the pulse thus generated the memory circuit 505 is updated to store the voltage in the master integrator, and at the trailing edge of the pulse the master integrator 501 is reset. The output of the master integrator 501 is thus a saw tooth wave, the maximum amplitude of which is dependent upon the frequency $F_o$.

The circuit of FIG. 5 is further comprised of a pair of slave integrators 511 and 521, which may be similar to the master integrator 501 and a pair of comparators 512 and 522 connected to receive the output voltage from the memory circuit 505. In this circuit, the voltage developed in each of the slave integrators 511 and 521 is compared in its respective comparator 522 and 512 with the voltage stored in the memory 505, the slave integrators being reset upon the occurrence of a comparison in the respective comparator.

Alternatively, the mono-stable sequencor 502 may be in the form of a two stage mono-stable multivibrator for producing a pair of short duration pulses for resetting the master integrator 501 and effecting the storage of the voltage from the master integrator in the memory circuit 505.

Alternatively, the slave integrators 511 and 521 may be in the form of presettable integrators which are chargeable to the voltage in the memory circuit 505 and run downwardly, in which case the comparators 512 and 522 are not necessary. The quantities "N", and "K" in the circuits of FIG. 5 are then factors proportional to the charge rates of the integrators 501, 511 and 521, in order to produce an output equivalent to that in the circuit of FIG. 3.

Figure 6:
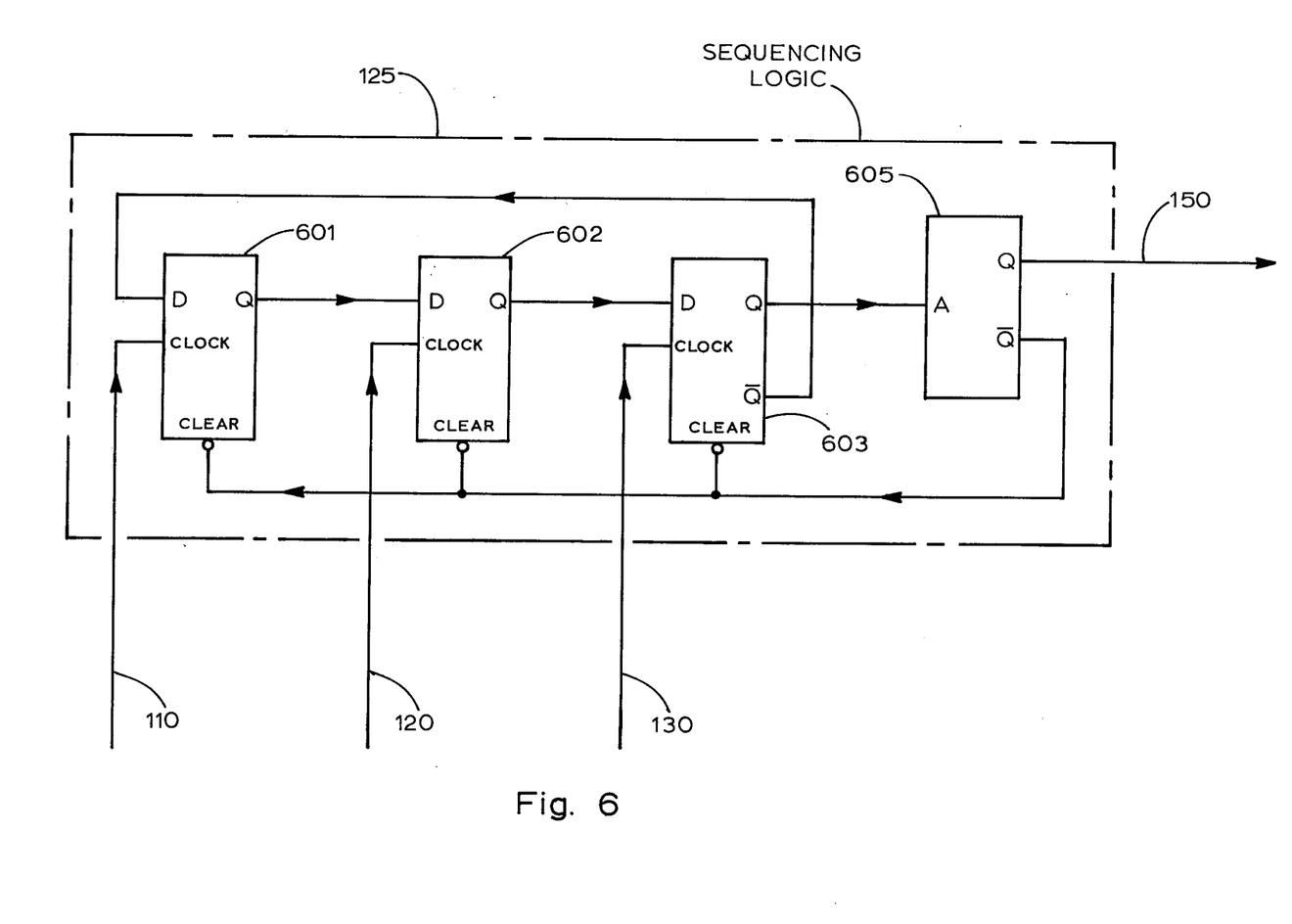

A sequencing logic circuit which may be employed in the circuit of FIG. 2 is illustrated in FIG. 6. As pointed out above, the sequencing logic circuit registers the events from the detectors 121, 122, and 123 on lines 110, 120 and 130, and provides a marker pulse on line 150 at the end of each proper sequence. In the arrangement of FIG. 6, the sequencing logic circuit is in the form of a three stage self starting ring counter or shift register.

The circuit of FIG. 6 is comprised of three flip-flop circuits 601, 602 and 603 and a mono-stable multivibrator 605. In this circuit the lines 110, 120 and 130 are applied to the clock inputs of the flip-flop 601, 602 and 603 respectively, and the clear terminals of these flip-flops are connected in common to the negated outputs of the multivibrator 605.

The Q outputs of the flip-flop 601, 602 and 603 are connected respectively to the D inputs of the flip-flops 602 and 603 and the trigger input of the multi-vibrator 605. The negated output of the flip-flop 603 is connected to the D input of the flip-flop 601. The output line 150 of this circuit is connected to the Q outputs of the mono-stable multivibrator 605.

The circuit of FIG. 6 operates as follows. Assuming that all of the flip-flops are clear, the D input of the flip-flop 601 is at logical 1, and the D inputs of flip-flops 602 and 603 are at logical 0, upon the first most positive peak detected by the detector 121, the leading edge of the pulse on line 110 clocks the flip-flop 601 to the logical 1 state, thereby enabling the flip-flop 602. Any further transitions of the pulse on the line 110 do not effect the circuit until the register is cleared. Upon the occurrence of a first most negative peak following the enabling of the flip-flop 602, the leading edge of a pulse on line 120 clocks flip-flop 602 to its logical 1 state, thereby enabling flip-flop 603. Then and only then upon the occurrence of the next zero crossing, the leading edge of the pulse on the line 130 clocks the flip-flop 603 to the logical 1 state, thereby tripping the mono-stable multivibrator 605. The multivibrator 605 simultaneously produces an output pulse on the line 150, and clears the register for the next sequence by means of the connection between the clear terminals of the flip-flops and the negated output of the multivibrator 605.

If, when power is first applied, all flip-flops are in the logical 1 state, and the mono-stable multivibrator 605 is unable to produce a pulse to clear the register, the register might remain locked. In this case, however, the negated Q output of the flip-flop 603 and thus the D input of the flip-flop 601, are at logical 0, and will remain at logical 0 until the repropagates through the register and the register is clear.

Although the invention has been described with reference to specific example embodiments, it is to be understood that it is intended to cover all modifications and equivalents within the scope of the appended claims.

What is claimed is:

1. A frequency multiplying system comprising a source of a time varying input signal to be multiplied, memory means, cyclic period marker means responsive to said input signal source for producing pulses at the fundamental frequency of said input signal, means responsive to said cyclic period marker means for producing first and second sampling signals having frequencies which are multiples of the fundamental frequency of said input signal means for continuously sampling said input signal with said first sampling signal and storing signal samples resulting from said sampling in said memory means, and means responsive to said second sampling signal for continuously reading out said stored signal samples from said memory means, whereby the ratio of the frequencies of the output of said memory means and said input signal is equal to the ratio of the frequencies of said second and first sampling signals.

2. The frequency multiplying system of claim 1, wherein said memory means comprises an addressing logic circuit, means responsive to said first sampling signal for passing information to said addressing logic circuit, a memory matrix circuit connected to store signals from said addressing logic circuit, a read logic circuit connected to said memory matrix circuit and responsive to said second sampling signal for reading out said memory matrix circuit, means applying said input signal to said addressing logic circuit, and means connected to said read logic circuit for producing said output signal.

3. The frequency multiplying system of claim 2, wherein said means applying said input signal to said addressing circuit comprises sampling gate means for sampling said input signal at the frequency of said first sampling signal, and analog to digital convertor means, and wherein the means for deriving the output signals from said read logic circuit comprises a digital to analog convertor.

4. The system of claim 3, wherein said addressing logic circuit and read logic circuit comprise shift register means.

5. The frequency multiplying system of claim 1, wherein said means responsive to said cyclic period marker for producing said first and second sampling signals comprises first, second and third clock sources, first, second and third counter means connected to be stepped by said first, second and third clock sources, memory circuit means, resetting means responsive to said input signal source for resetting said first counter means and applying the count stored therein to said memory means, and means responsive to a comparison of the count stored in said memory matrix circuit with the count stored in said second and third counter means for resetting said second and third counter means respectively, whereby the first and second sampling signals are reset signals provided by said second and third counter means respectively.

6. The frequency multiplying system of claim 1, wherein said cyclic period marker means comprises positive peak detector means, negative peak detector means and zero crossing detector means connected to said input signal source to receive said input signal, and sequencing logic means connected to said detector means for producing output pulses at the frequency of the fundamental of said input signal only in response to the sequential occurrence of outputs from said positive peak detector, negative peak detector, and zero crossing detector.

7. The frequency multiplying system of claim 1, wherein said means responsive to said cyclic period marker means for producing first and second sampling signals comprises first, second and third integrators, analog memory means, mono-stable sequencing means responsive to said input signal for resetting said first integrator and applying a voltage therein to said memory means at the rate of the fundemental of the frequency of the input signal, means for applying the voltages in said memory means and in said second and third integrating means to said second and third comparator means respectively and for resetting the respective second and third integrator means in response to comparisons detected in said second and third comparing means respectively, and means for deriving said first and second sampling signals from said second and third integrating means respectively.

8. A frequency multiplying system comprising a source of input signals to be multiplied, first and second resettable storage means for storing quantities varying unidirectionally at first and second predetermined different rates, memory means, means responsive to said input signals for resetting said first storage means and applying the quantity stored therein to said memory means, and comparing means responsive to the comparison of the quantities stored in said memory means and said resettable storage means for resetting said second resettable storage means, whereby the ratio of the frequencies of the output of said second resettable storage means and said input signal is equal to the ratio of the storage rates of said second and first storage means.

9. The frequency multiplying system of claim 8, wherein said first and second resettable storage means comprise first and second resettable counter means and first and second clock sources respectively, the clock sources having different frequencies and being connected to step said first and second counter means respectively, and said memory means comprises digital memory means, whereby the ratio of the frequencies of the output of the second counter means and the input signal is equal to the ratio of the frequencies of the second and first clocks respectively.

10. The frequency multiplying system of claim 9, wherein said means responsive to said input signals comprises a synchronizing logic circuit responsive to said input signals for controlling said memory means to store a signal therein corresponding to the data in said first counter means in response to a first clock pulse from said first clock source following said input signal and to reset and first counter means at the next succeeding clock pulse from said first clock source.

11. The frequency multiplying system of claim 8, wherein said first and second resettable storage means comprise first and second integrating means, whereby the ratio of the frequencies of the output of said second integrating means and said input signal is equal to the ratio of the charge storage rates of said second and first integrating means respectively.

12. A method for producing a second signal having a frequency that is a multiple of the frequency of a first signal, comprising stepping a first counter at a first clock rate, resetting said first counter at the rate of the fundamental of said first signal and storing the count in said first counter prior to the resetting thereof, stepping a second counter at a second clock rate, and resetting said second counter at each coincidence of counts in said second counter with said stored count, whereby the ratio of the frequencies of the output of said second counter and said input signal is equal to the ratio of said second and first clock rates.

13. A method for producing a second signal having a frequency that is a multiple of the frequency of a first signal, comprising stepping a first counter at a first clock rate, resetting said first counter at the rate of the fundamental of said first signal and storing the count from said first counter prior to the resetting thereof, stepping a second reverse counter at a second clock rate, and loading said stored count into said second counter at each coincidence with 0 counts in said second counter, whereby the ratio of the frequencies of the output of said second counter and said second input signal is equal to the ratio of said second and first clock rates.

14. Apparatus for multiplying the frequency of a continuous analog input signal while reproducing the wave form shape thereof without distortion, comprising memory means for storing wave form amplitude of the input signal during each signal period, signal sampling control means connected to the memory means and responsive to the input signal for rendering the memory means operative to sequentially sample and store a predetermined number of segments of the wave form amplitude during each of the signal periods, readout control means for sequentially transferring said predetermined number of wave form amplitude segments from the memory means, during a readout period of a duration that is a programmed function of the signal period, frequency control means connected to the readout control means for selecting an output frequency that is a multiple of said input frequency and output means connected to the memory means for transmitting an envelope of said transferred wave form segments at said output frequency.

15. The combination of claim 14, wherein said predetermined number of wave form segments is a constant multiple of the frequency of the input signal.

16. The combination of claim 15, including means for digitizing the input signal into pulses of constant width at the input frequency of the input signal, said pulses being fed to the signal sampling control means.

17. The combination of claim 16, wherein said sampling and readout control means include frequency changing devices for respectively converting said input pulses into write and read clock pulses and address logic devices connected to the frequency changing devices for controlling sampling and readout operations of the memory means in response to said clock pulses.

18. The combination of claim 17, wherein the frequency control means includes an externally programmable frequency changing device connected to the first mentioned frequency changing device for converting the input pulses with the read clock pulses.

19. The combination of claim 14, including means for digitizing the input signal into pulses of constant width at the input frequency of the input signal, said pulses being fed to the signal sampling control means.

20. The combination of claim 19, wherein said sampling and readout control means include frequency changing devices for respectively converting said input pulses into write and read clock pulses and address logic devices connected to the frequency changing devices for controlling sampling and readout operations of the memory means in response to said clock pulses.

21. The combination of claim 20, wherein the readout control means further includes an externally programmable frequency changing device in series with the first mentioned frequency changing device.

22. The combination of claim 14, wherein said memory means includes a plurality of analog sampling switches equal in number to said wave form segments a plurality of readout switches respectively connected in series with the sampling switches, and storage capacitors connected between said sampling and readout switches.

23. The combination of claim 14, wherein said input signal has an input frequency within the audio frequency range, and means in the sampling rate control means for sampling the input signal at a rate higher than the frequencies in the audio range.

24. The combination of claim 23, wherein said memory means is of the digital type.

25. The combination of claim 14, including means for controlling the sampling of the input signal at a continuous rate that is a product of the frequency of the input signal and a constant.

26. The combination of claim 14, including means for controlling the sampling of the input signal at a rate continuously up-dated in accordance with changes in frequency of the input signal.

27. Apparatus for multiplying the frequency of an input signal while preserving the wave form shape thereof, comprising memory means for storing wave form amplitude of the input signal during each signal period, means for digitizing the input signal into input pulses of constant width at the input frequency of the input signal, a first frequency changing device for converting said input pulses fed thereto into write pulses, a write address logic device transmitting said write pulses to the memory means for rendering the same operative to sequentially sample and store segments of the wave form amplitude during each of said signal periods equal in number to a constant multiple of the frequency of the input signal, a second frequency changing device for converting said input pulses into read pulses, a read address logic device transmitting said read pulses to the memory means for sequentially transferring therefrom the wave form amplitude segments stored therein, an externally programmable frequency changing device connected to the second frequency changing device for rendering the memory means operative to transfer said wave form amplitude segments during a readout period of a duration that is a programmed function of the signal period, an output means connected to the memory means for transmitting an envelope of said transferred wave form segments at an output frequency that is the reciprocal of said readout period, said memory means including a plurality of analog sampling switches equal to number to said wave form segments, a plurality of readout switches respectively connected in series with the sampling switches, and storage capacitors connected between said sampling and readout switches.

* * * * *